(12) United States Patent
Irwin et al.

(10) Patent No.: US 6,188,707 B1
(45) Date of Patent: Feb. 13, 2001

(54) MOUNTING STRUCTURE FOR LASER DIODE BARS

(76) Inventors: Timothy L. Irwin; Judith B. Irwin, both of 145 Penn La., Rochester, NY (US) 14625

( * ) Notice: Under 35 U.S.C. 154(b), the term of this patent shall be extended for 0 days.

(21) Appl. No.: 09/213,301

(22) Filed: Dec. 15, 1998

Related U.S. Application Data

(63) Continuation-in-part of application No. 08/788,135, filed on Jan. 24, 1997, now abandoned, which is a continuation-in-part of application No. 08/407,446, filed on Mar. 20, 1995, now Pat. No. 5,627,850.

(51) Int. Cl.[7] .......................................................... H01S 5/00
(52) U.S. Cl. ................... 372/43; 372/43; 372/34; 372/36; 372/50; 372/97; 372/69; 372/75
(58) Field of Search .................................. 372/43, 34, 36, 372/50, 97, 69, 75

(56) References Cited

U.S. PATENT DOCUMENTS

| | | | | |
|---|---|---|---|---|
| 5,040,187 | * | 8/1991 | Karpinski | 372/50 |
| 5,128,951 | * | 7/1992 | Karpinski | 372/50 |
| 5,284,790 | * | 2/1994 | Karpinski | 437/129 |
| 5,627,850 | * | 5/1997 | Irwin et al. | 372/43 |

* cited by examiner

*Primary Examiner*—Frank G. Font
*Assistant Examiner*—Delma R. Flores Ruiz
(74) *Attorney, Agent, or Firm*—Robert J. Bird

(57) ABSTRACT

A laser diode bar mounting structure includes a dielectric substrate with an overlying conductor, and diode bar spaces through the conductor layer to support laser diode bars within them. The bar spaces are configured with parallel upper sidewalls and flared out or expanded bottoms to dissipate capillary action of solder under the diode bars.

5 Claims, 5 Drawing Sheets

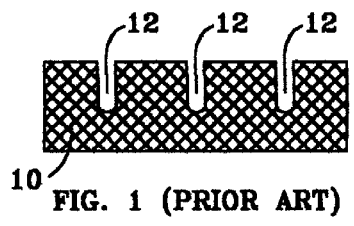
FIG. 1 (PRIOR ART)
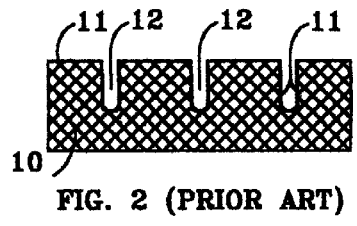
FIG. 2 (PRIOR ART)
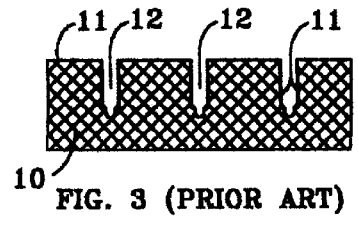
FIG. 3 (PRIOR ART)
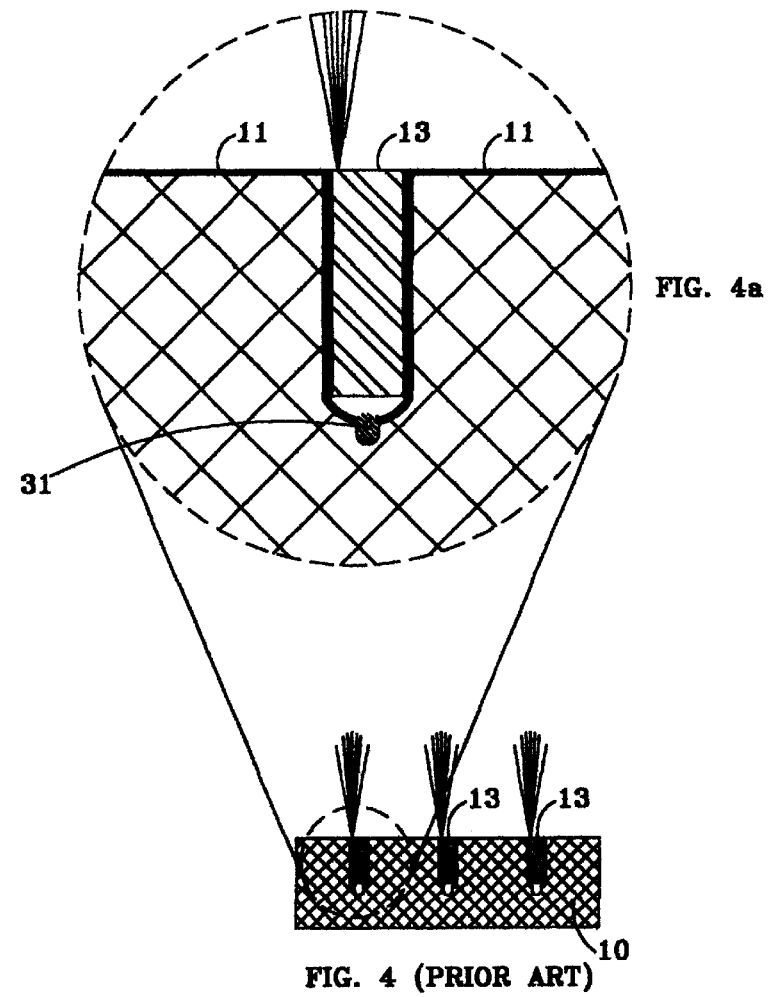
FIG. 4a
FIG. 4 (PRIOR ART)

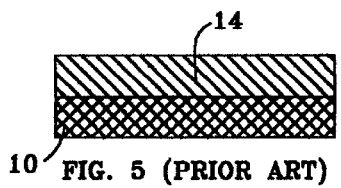
FIG. 5 (PRIOR ART)
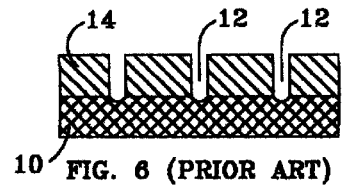
FIG. 6 (PRIOR ART)
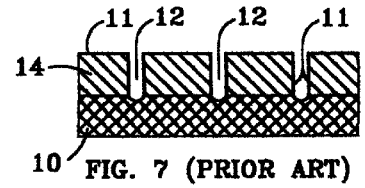
FIG. 7 (PRIOR ART)
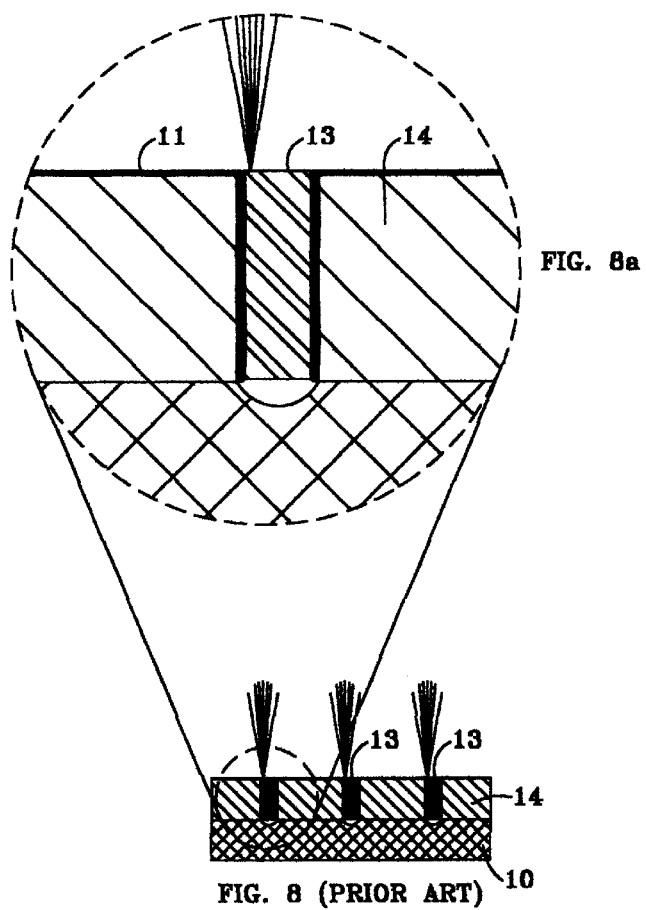
FIG. 8a
FIG. 8 (PRIOR ART)

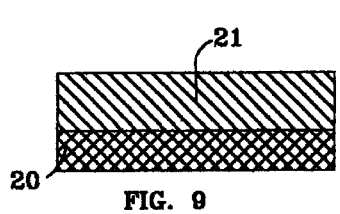
FIG. 9
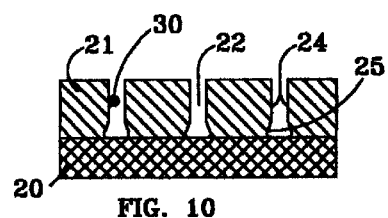
FIG. 10
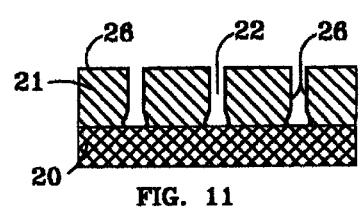
FIG. 11
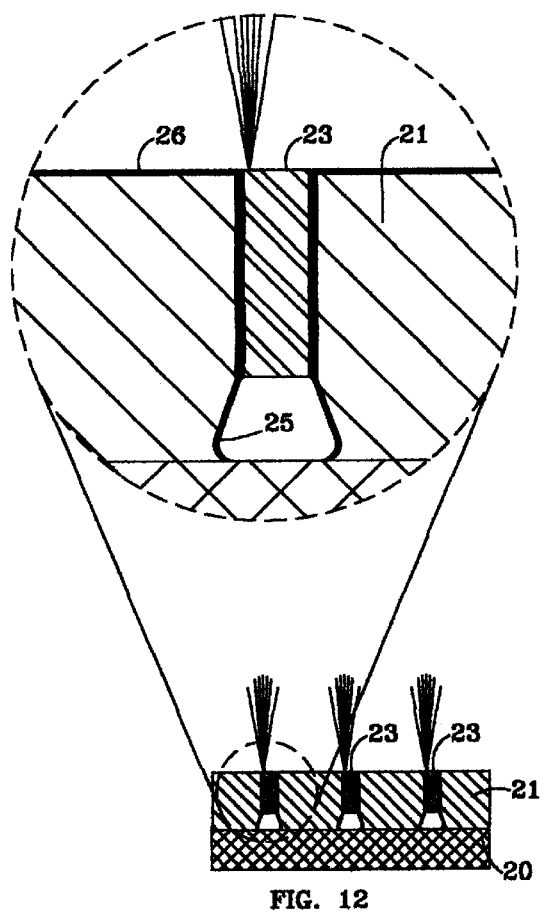
FIG. 12a
FIG. 12

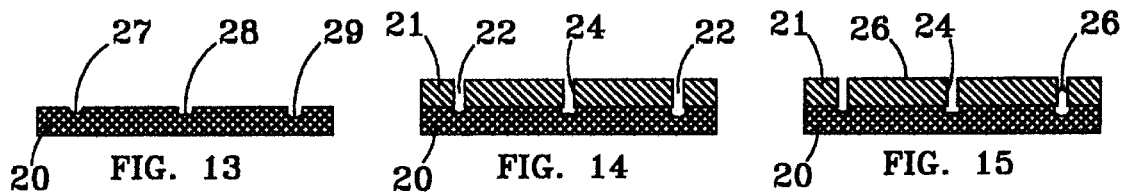
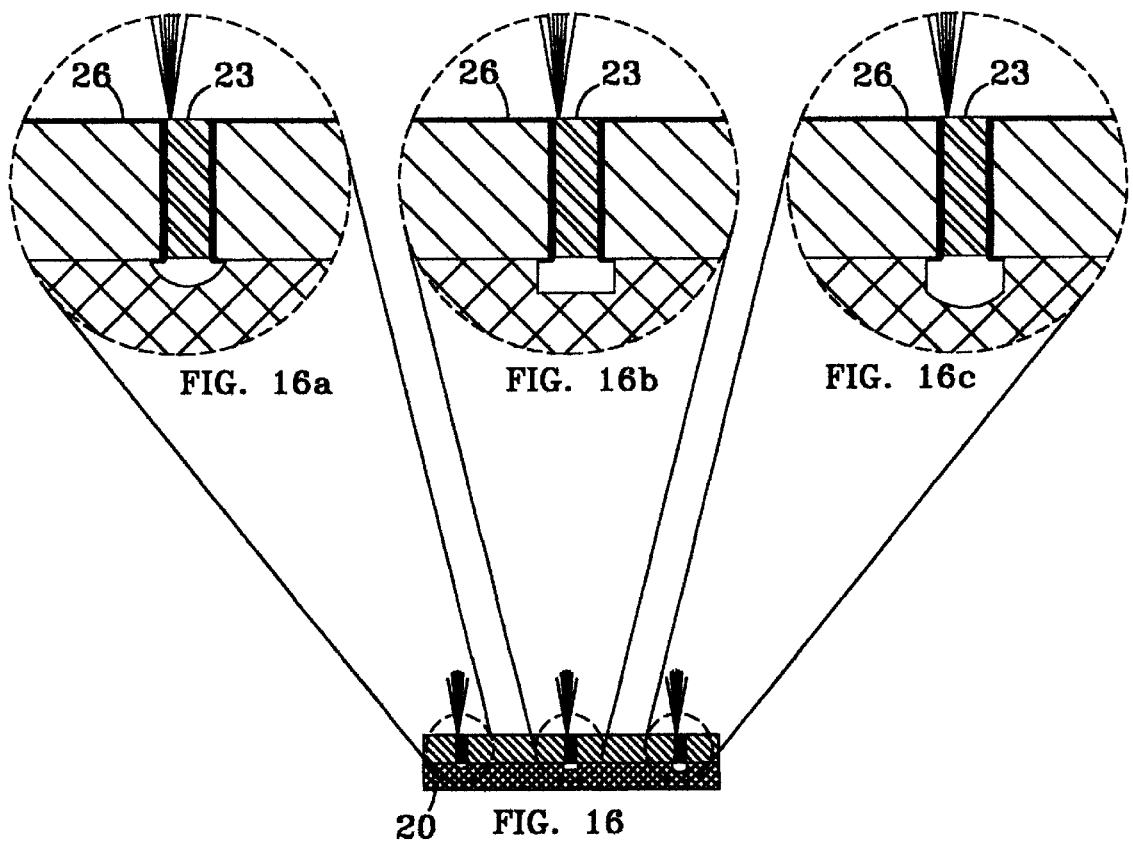

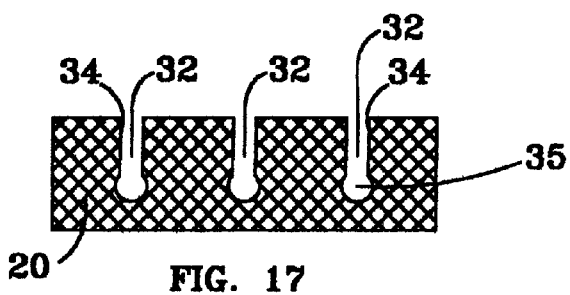
FIG. 17
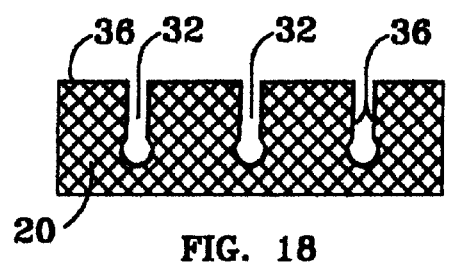
FIG. 18
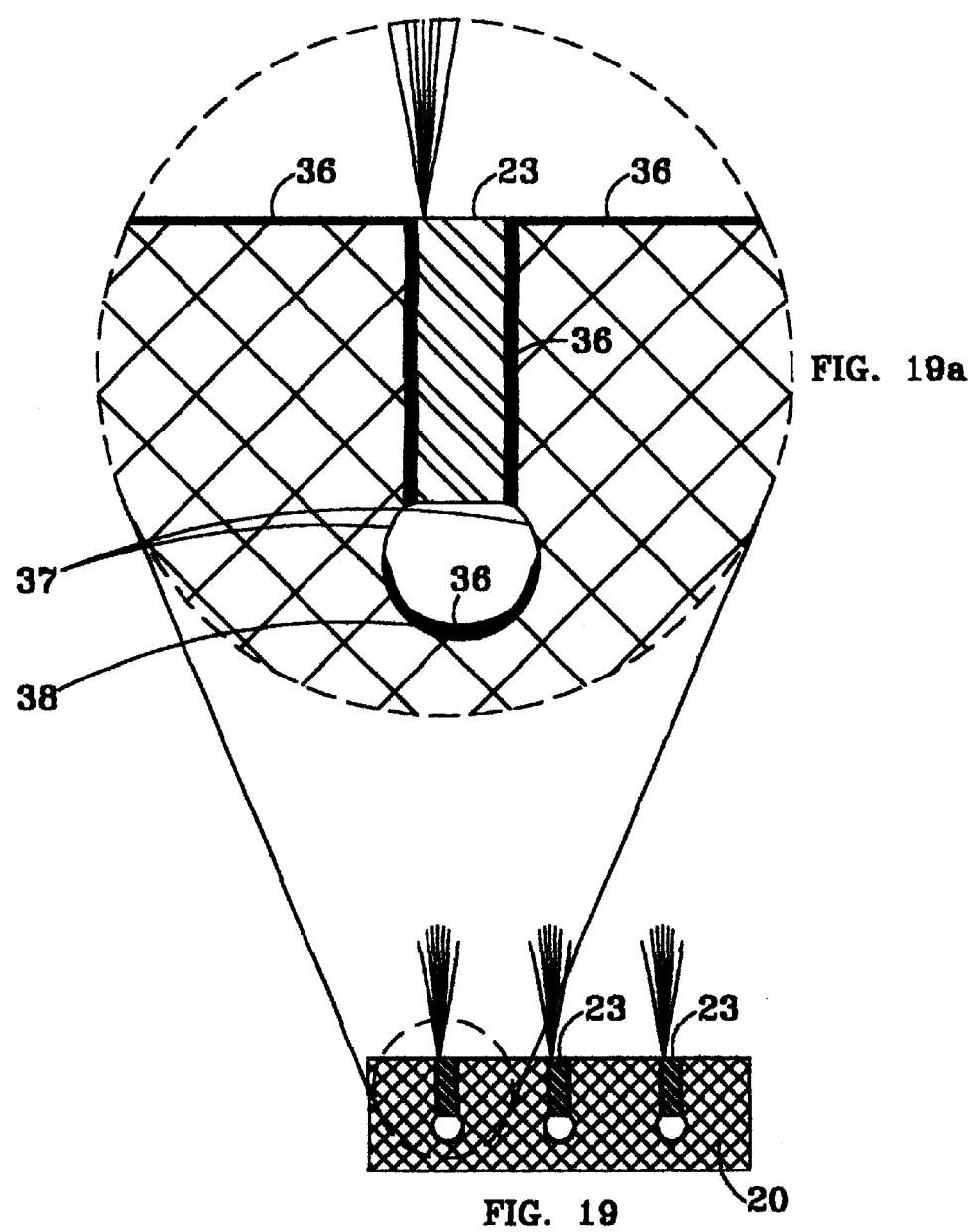
FIG. 19a
FIG. 19

US 6,188,707 B1

MOUNTING STRUCTURE FOR LASER DIODE BARS

CROSS-REFERENCE TO RELATED APPLICATIONS

This is a continuation-in-part of applicaton Ser. No. 08/788,135 filed Jan. 24, 1997 now abandoned, which is a continuation-in-part of applicaton Ser. No. 08/407,446 filed Mar. 20, 1995, now U.S. Pat. No. 5,627,850, issued May 6, 1997.

FIELD OF THE INVENTION

This invention relates to the structure and fabrication of laser diode arrays for laser excitation.

BACKGROUND AND INFORMATION DISCLOSURE STATEMENT

One method of exciting a laser crystal is by means of laser diodes in arrays placed adjacent to the laser crystal.

U.S. Pat. No. 5,040,187 to Karpinski, issued Aug. 13, 1991, and U.S. Pat. No. 5,128,951 to Karpinski, issued Jul. 7, 1992 are the most relevant prior art that we know of. Each of them discloses a flat dielectric substrate with an overlying conductive layer, and laser diode bars mounted in grooves in the conductive layer. The Karpinski patents are more fully discussed below in connection with FIGS. 1–8 herein.

SUMMARY OF THE INVENTION

A laser diode bar mounting structure according to this invention includes a dielectric substrate with an overlying conductor, and diode bar spaces through the conductor layer to support laser diode bars within them. The bar spaces are configured with generally parallel upper sidewalls and flared out or expanded bottoms to dissipate capillary action of solder under the diode bars.

DRAWINGS

FIGS. 1–4 and 5–8 are sectional views of diode bar mounting structures of the prior art.

FIGS. 9–12 are sectional views of a diode bar mounting structure in one form of this invention.

FIGS. 13–16 are sectional views of diode bar mounting structures in a second form of this invention.

FIGS. 17–19 are sectional views of a diode bar mounting structure in a third form of this invention.

DESCRIPTION

FIGS. 1–4 represent fabrication stages of a diode bar mounting structure according to the aforementioned Karpinski U.S. Pat. No. 5,040,187. FIG. 1 shows a dielectric substrate layer 10, typically of beryllium oxide (BeO), with parallel grooves 12 in its face. In FIG. 2, a metalization layer 11 is formed on the substrate 10 and in the grooves 12. In FIG. 3, the layer 11 is cut at the bottom of each groove 12 by a disk saw or the like. In FIG. 4, a laser diode bar 13 is inserted and soldered into each groove 12. The metalization layer 11 is cut at the bottom of each groove to break its electrical continuity so current will go through the inserted diode bar 13 and will not be short circuited around it. FIG. 4 includes a blown-up view of a single groove 12 and diode bar 13 for a clearer showing of detail.

FIGS. 5–8 represent fabrication stages of a diode bar mounting structure according to the aforementioned Karpinski U.S. Pat. No. 5,128,951. FIG. 5 shows a dielectric substrate layer 10, typically of beryllium oxide (BeO), with an overlying conductor layer 14. In FIG. 6, parallel grooves 12 are cut through the conductor layer 14 and into the dielectric substrate layer 10. In FIG. 7, a metalization layer 11 is deposited on the conductor 14 and in the grooves 12. In FIG. 8, a laser diode bar 13 is inserted and soldered into each groove 12. FIG. 8 also includes a blown-up view of a single groove 12 and diode bar 13.

In the prior art just described, the grooves 12 are typically cut by a disk saw. Cutting the grooves 12 with a disk saw makes it inherent that their sidewalls are parallel for most or all of their depth, as shown in FIGS. 1–4 and 6–8, and that they can only converge at their bottoms. The bottoms of such grooves might be flat, or they might be somewhat curved or tapered as shown, but they cannot be wider than their upper portions. A potential problem with bar grooves of such a configuration is illustrated in FIG. 4. With the inwardly tapered bar groove 12 shown there, it is possible for excess solder to migrate by capillary action and collect in a pool 31 under the bottom of a diode bar 13, forming a short circuit around the diode bar.

FIGS. 9–12 represent fabrication stages of a diode bar mounting structure according to this invention. The structure includes a dielectric substrate 20, preferably of beryllium oxide, and an overlying conductor layer 21, preferably of copper. The conductor layer 21 is segmented by a number of parallel diode bar spaces 22 cut through it A diode bar 23 is mounted and soldered into each space, so that the segmented layer 21 and diode bars 23 together form a path for electric current.

The diode bar spaces 22 are preferably cut through the conductor layer 21 by electric discharge machining. Electric discharge machining is an electrolytic process in which a consumable cathode electrode wire 30 is moved into an anode workpiece, electrically discharging metal from the anode workpiece. The traveling electrode wire 30 is fed continually as it is partially consumed. The process is flushed with deionized water as it proceeds. Electric discharge machining is a known machining process and a thorough discussion of it is not necessary here. For the present purpose, electric discharge machining can be thought of as analogous to cutting cheese with a wire. The analogy may be simplistic, but it provides a spatial concept of the cutting action.

The diode bar spaces 22 are formed with generally parallel upper sidewalls 24 and flared out bottom portions 25. The electrode wire 30 makes this possible. The configuration of the diode bar space 22 is determined by the path of the traveling electrode wire 30, and that path is relatively unconstrained. This is a fundamental difference between this invention and prior art bar grooves cut by a disk saw. As stated earlier, it is inherent that a groove cut with a disk saw cannot be wider at the bottom than at the top. The cutting path of a disk saw is inherently limited by the structure of the disk itself.

The traveling electrode wire 30 may be of such diameter that a single pass of the wire will create a bar space 22 suitable for insertion of a laser diode bar 23. It is preferably of a smaller diameter as shown in FIG. 10, in which case the wire 30 will cut down one side of the bar space and up the other side, with the resulting cut-out piece flushed out by water. The path of the wire defines the shape of the bar space.

In FIG. 11, a metalization layer 26 is deposited on the conductive layer 21 to aid the soldering process. Metalization might consist of several layers of differing metals or metal alloys. The final layer is typically gold or a gold alloy. Gold prevents oxides from forming on the metal layers under it. Gold also enhances the flow of solder over its surface, providing a wicking effect between laser diode bars 23 and the inside surfaces of bar spaces 22.

Laser diode bars 23 are fixed in place in the bar spaces 22 by solder. The flared out bottom 25 of the bar space 22 (FIG. 12) provides an expanded and flat cavity for solder, as compared with the constricted and concave space available in prior art grooves (FIG. 4). The flared out bottom 25 of the bar space 22 of this invention prevents solder from pooling as in FIG. 4, or minimizes the likelihood of such pooling.

Electric discharge machining works only on a conductive workpiece. Consequently, another advantage of the technique of this invention is that the traveling electrode wire 30 cuts into and through the conductor layer 21 but does not cut or otherwise affect the dielectric substrate 20. As a result, the bottoms 25 of bar spaces 22, in addition to being expanded or flared out, are assured to be flat and not concave.

FIGS. 13–16 represent fabrication stages of a diode bar mounting structure in a second form of this invention. In FIG. 13, cavities are first formed in a dielectric substrate 20 as shown in three examples 27, 28, 29. In FIG. 14, a conductor layer 21 is added and bar spaces 22 with generally parallel upper sidewalls 24 are cut through it. In FIG. 15, a metalization layer 26 is deposited on the conductor layer 21 and particularly on the upper sidewalls 24 to aid the next step. In FIG. 16, a diode bar 23 is soldered into each bar space 22.

FIGS. 17–19 represent fabrication stages of a diode bar mounting structure in a third form of this invention. In FIG. 17, bar slots 32 with generally parallel upper sidewalls 34 are cut into a dielectric substrate 20, and an expanded cavity 35 is cut along the bottom of each bar slot 32 by a microdrill, needle file, wire saw, or the like. In FIG. 18, a metalization layer 36 is deposited on the dielectric substrate 20 and bar slots 32 by a vacuum deposition process. In this form of the invention, the metalization layer 36 is not only to aid the soldering process; it is also the conductor layer. It serves the same function here as the separate conductor layers 21 in the embodiments of FIGS. 9–12 and 13–16. In FIG. 19, a diode bar 23 is soldered into each bar slot 32.

The enlarged view of FIG. 19 shows that the expanded bottom cavity 35 has side surface areas 37 where metalization and solder does not attach. This is because metalization is applied by a vacuum deposition process in which metal is sprayed in a direct line of sight. The bottom area 38 of the bottom cavity 35 is within sight of the metal spray, so metalization and excess solder will attach there.

The dielectric material 20 (including side surface areas 37 in FIG. 19) is repellant to solder in a way that is analagous to the mutual repulsion of grease and water. The metal surfaces (26 in FIG. 12 and FIG. 16, and 36 in FIG. 19) are receptive to solder.

The term "overlying conductor" in this specification includes conductive film formed by metalization on a substrate, and conductive sheet or plate placed on a substrate. "Conductor" and "conductive", unless otherwise qualified, mean electical conductor and electrically conductive, respectively.

"Upper", "lower", "top", "bottom", "over", "under", and like terms are used herein with reference to structural orientations illustrated (for example) in FIGS. 11, 15, and 18. Such terms will retain their meanings regardless of physical orientation of the described structure. Thus, if the device in FIG. 11 (for example) is turned "upside down", the bar space opening is still the "top", and its flared portion is still the "bottom".

The foregoing description of preferred embodiments of this invention, including any dimensions, angles, or proportions, is intended as illustrative. The concept and scope of the invention are limited only by the following claims and equivalents thereof.

What is claimed is:

1. Laser diode bar mounting structure to prevent solder migration and short circuiting around said laser diode bar, including:

a dielectric substrate;

conductor segments disposed on said substrate, adjacent segments defining therebetween a diode bar space for mounting and soldering a laser diode bar therein;

said bar space having substantially parallel upper sidewalls and a flared out bottom to assist the flow of excess solder out and away from the bottom of said laser diode bar to thereby prevent solder migration and short circuiting under said laser diode bar.

2. Laser diode bar mounting structure to prevent solder migration and short circuiting around said laser diode bar, including:

a dielectric substrate;

conductor segments disposed on said substrate, adjacent segments defining therebetween an upper diode bar space with substantially parallel sidewalls for mounting and soldering a laser diode bar therein;

said substrate defining a lower diode bar space in registry with said upper diode bar space and wider than said upper diode bar space to assist the flow of excess solder out and away from the bottom of said laser diode bar to thereby prevent solder migration and short circuiting under said laser diode bar.

3. Laser diode bar mounting structure to prevent solder migration and short circuiting around said laser diode bar, including:

a dielectric substrate;

said substrate including a diode bar slot for mounting and soldering a laser diode bar therein, said bar slot having substantially parallel upper sidewalls and a flared out bottom cavity with recessed sidewalls; and a conductor layer deposited by line-of-sight metalization on said substrate and on said upper sidewalls of said bar slot, but not on said recessed sidewalls of said bottom cavity, to prevent solder migration and short circuiting under said laser diode bar.

4. A method of mounting a laser diode bar to prevent solder migration and short circuiting around said laser diode bar, including the following steps:

(a) forming a conductor layer on a dielectric substrate;

(b) cutting a diode bar space through said conductor layer to said dielectric substrate and, concurrently;

(c) advancing said cutting step through said conductor layer to configure said diode bar space with substantially parallel upper sidewalls and a flared out bottom;

(d) positioning a laser diode bar in said bar space; and (e) applying solder between said upper sidewalls and said laser diode bar;

whereby the flow of excess solder is out and away from the bottom of said laser diode bar to prevent solder migration and short circuiting under said laser diode bar.

5. A method of mounting a laser diode bar to prevent solder migration and short circuiting around said laser diode bar, including the following steps:
 (a) forming, in a dielectric substrate, a diode bar slot for mounting and soldering a laser diode bar therein, said bar slot having substantially parallel upper sidewalls and a flared out bottom cavity with recessed sidewalls; and
 (b) depositing by line-of-sight metalization a conductor layer on said substrate and on said upper sidewalls of said bar slot, but not on said recessed sidewalls of said bottom cavity;
 (c) positioning a laser diode bar in said bar slot; and
 (d) applying solder between said upper sidewalls and said laser diode bar;
 whereby excess solder is repelled from said recessed sidewalls to prevent solder migration and short circuiting under said laser diode bar.

* * * * *